US012637327B2

(12) United States Patent
Zhou et al.

(10) Patent No.: US 12,637,327 B2
(45) Date of Patent: May 26, 2026

(54) CONDITION DETECTING METHOD AND DEVICE FOR SURFACE INSULATING LAYER OF ELEVATOR TRACTION BELT

(71) Applicant: Otis Elevator Company, Farmington, CT (US)

(72) Inventors: Xuegang Zhou, Shanghai (CN); ZhenXing Peng, Shanghai (CN); Di Wu, Shanghai (CN)

(73) Assignee: OTIS ELEVATOR COMPANY, Farmington, CT (US)

( * ) Notice: Subject to any disclaimer, the term of this patent is extended or adjusted under 35 U.S.C. 154(b) by 1598 days.

(21) Appl. No.: 17/094,467

(22) Filed: Nov. 10, 2020

(65) Prior Publication Data

US 2021/0284502 A1 Sep. 16, 2021

(30) Foreign Application Priority Data

Mar. 16, 2020 (CN) .......................... 202010181230.8

(51) Int. Cl.
  *B66B 7/12* (2006.01)
  *B66B 5/00* (2006.01)
  (Continued)

(52) U.S. Cl.
  CPC .......... *B66B 7/1223* (2013.01); *B66B 5/0031* (2013.01); *B66B 7/1207* (2013.01);
  (Continued)

(58) Field of Classification Search
  CPC ... B66B 7/1223; B66B 5/0031; B66B 7/1207; B66B 5/02; B66B 7/062; G01R 31/1209; G01R 31/1218
  See application file for complete search history.

(56) References Cited

U.S. PATENT DOCUMENTS 5,907,280 A * 5/1999 Afilani ................... G01N 27/60
                                                      340/568.1
6,636,031 B1 * 10/2003 Kenmochi ........... G01N 27/205
                                                      324/693
(Continued)

FOREIGN PATENT DOCUMENTS

CN          1350639 A       5/2002
CN          101767739 A     7/2010
(Continued)

OTHER PUBLICATIONS

Chinese Office Action for Application No. 202010181230.8, Issued Mar. 21, 2024, 12 Pages.
(Continued)

*Primary Examiner* — Ryan J. Walters
(74) *Attorney, Agent, or Firm* — CANTOR COLBURN LLP

(57) ABSTRACT

A condition detecting method and device for a surface insulation layer of an elevator traction belt. The condition detecting method includes: positioning a detecting component adjacent to the surface insulation layer of the elevator traction belt; moving the elevator traction belt relative to the detecting component, so that the detecting component scans the surface insulation layer of the elevator traction belt; applying static electricity to the detecting component through a static electricity generation component; detecting the reaction of the elevator traction belt to the static electricity; and identifying the condition of the surface insulation layer of the elevator traction belt according to the detected reaction of the elevator traction belt to the static electricity.

9 Claims, 3 Drawing Sheets

(51) Int. Cl.

| | | |
|---|---|---|
| *G01R 31/12* | (2020.01) | |
| *B66B 5/02* | (2006.01) | |
| *B66B 7/06* | (2006.01) | |

(52) U.S. Cl.
CPC ..... *G01R 31/1209* (2013.01); *G01R 31/1218* (2013.01); *B66B 5/02* (2013.01); *B66B 7/062* (2013.01)

(56) References Cited

U.S. PATENT DOCUMENTS

| | | | | |
|---|---|---|---|---|
| 8,997,973 | B2 * | 4/2015 | DePaso | ................. B65G 43/00 |
| | | | | 198/691 |
| 10,202,258 | B2 * | 2/2019 | Dold | ......................... B66B 5/02 |
| 2014/0144756 | A1 * | 5/2014 | DePaso | .................... H05F 3/00 |
| | | | | 198/804 |
| 2017/0275135 | A1 * | 9/2017 | Dold | ......................... B66B 5/02 |

FOREIGN PATENT DOCUMENTS

| | | | |
|---|---|---|---|
| CN | 103175867 | A | 6/2013 |
| CN | 109230952 | A | 1/2019 |
| CN | 109313951 | A | 2/2019 |
| EP | 3042874 | A1 | 7/2016 |
| JP | 2002348068 | A | 12/2002 |
| JP | 2008081306 | A | 4/2008 |
| KR | 20070012359 | A | 1/2007 |
| WO | 2012054304 | A1 | 4/2012 |

OTHER PUBLICATIONS

European Search Report for Application No. 20214600.7; Issued Apr. 6, 2023; 4 Pages.

European Search Report for Application No. 20214600.7; Issued Jun. 1, 2021; 8 Pages.

Chinese Office Action for Application No. 202010181230.8, Issued May 9, 2025, 14 Pages.

* cited by examiner

CONDITION DETECTING METHOD AND DEVICE FOR SURFACE INSULATING LAYER OF ELEVATOR TRACTION BELT

FOREIGN PRIORITY

This application claims priority to Chinese Patent Application No. 202010181230.8, filed Mar. 16, 2020, and all the benefits accruing therefrom under 35 U.S.C. § 119, the contents of which in its entirety are herein incorporated by reference.

FIELD OF THE INVENTION

The present application relates to the field of structural integrity test for elevator traction belts. More specifically, the present application relates to a condition detecting method for a surface insulation layer of an elevator traction belt, which aims to detect structural integrity of the surface insulation layer of the elevator traction belt. The present application also relates to a condition detecting device for a surface insulation layer of an elevator traction belt.

BACKGROUND OF THE INVENTION

Normal operation of an elevator is of vital importance to the lives and property safety of elevator users. Due to the existence of many moving components in the elevator, the coordination relationships between the various components are complex, and damage to the structural integrity of any of these components may potentially threaten the safety of the elevator. For example, a traction belt or traction steel belt of the elevator is directly connected to an elevator car and a counterweight, and thus the traction belt or traction steel belt is critical to the safety of passengers in the elevator car. Therefore, it is desired that the traction steel belt of the elevator does not have any health problem that affects the safe operation.

It is required to monitor the conditions of components of the elevator's traction steel belt continuously and effectively. However, the existing condition detecting methods mainly rely on visual inspection by the maintenance personnel, and therefore are time-consuming and lack accuracy.

Therefore, there is an ongoing need for new solutions of condition detecting method and device for a surface insulation layer of an elevator traction belt. It is desirable that the new solutions can alleviate the above problems at least to some extent.

SUMMARY OF THE INVENTION

The object of one aspect of the present application is to provide a condition detecting method for a surface insulation layer of an elevator traction belt, which aims to provide a stable and automated detection of structural integrity of the elevator traction belt. The object of another aspect of the present application is to provide a condition detecting device for a surface insulation layer of an elevator traction belt.

The objects of the present application are achieved by the following technical solutions.

A condition detecting method for a surface insulation layer of an elevator traction belt, which includes the following steps: positioning a detecting component adjacent to the surface insulation layer of the elevator traction belt; moving the elevator traction belt relative to the detecting component, so that the detecting component scans the surface insulation layer of the elevator traction belt; applying static electricity to the detecting component through a static electricity generation component; detecting the reaction of the elevator traction belt to the static electricity; and identifying the condition of the surface insulation layer of the elevator traction belt according to the detected reaction of the elevator traction belt to the static electricity.

In the above condition detecting method, optionally, the detecting the reaction of the elevator traction belt to the static electricity includes detecting a current fluctuation between the detecting component and the surface insulation layer of the elevator traction belt, an acoustic signal of the electrical spark or an optical signal of the electrical spark.

In the above condition detecting method, optionally, the static electricity generation component is configured to be grounded.

In the above condition detecting method, optionally, when it is detected that the current fluctuation between the detecting component and the surface insulation layer of the elevator traction belt exceeds a predetermined value, and/or when the acoustic signal of the electrical spark is detected, and/or when the optical signal of the electrical spark is detected, it is judged that the surface insulation layer is defective.

In the above condition detecting method, optionally, when it is judged that the surface insulation layer is defective, one or more of the following operations are performed: sending a sound alarm, sending a visual alarm, stopping the elevator, and parking the elevator at the closest floor.

In the above condition detecting method, optionally, the dimension of the detecting component is set to be larger than or equal to the width dimension of the elevator traction belt.

In the above condition detecting method, optionally, the detecting component includes a plurality of wires or filaments formed by a conductive material.

In the above condition detecting method, optionally, the static electricity generation component is configured to generate static electricity with a voltage of 2-10 kV and a pulse frequency of 10-100 Hz.

A condition detecting device for a surface insulation layer of an elevator traction belt, which includes: a detecting component positioned adjacent to the surface insulation layer of the elevator traction belt; a static electricity generation component electrically connected to the detecting component; and a controller configured to cause the static electricity generation component to apply static electricity to the detecting component, detect the reaction of the elevator traction belt to the static electricity, and identify the condition of the surface insulation layer of the elevator traction belt according to the detected reaction of the elevator traction belt to the static electricity.

In the above condition detecting device, optionally, a sensing component is further included configured to sense a current fluctuation between the detecting component and the surface insulation layer of the elevator traction belt, an acoustic signal of the electrical spark or an optical signal of the electrical spark.

In the above condition detecting device, optionally, the static electricity generation component is configured to be grounded.

In the above condition detecting device, optionally, the controller is configured to judge that the surface insulation layer is defective, when it is detected that the current fluctuation between the detecting component and the surface insulation layer of the elevator traction belt exceeds a predetermined value, and/or when the acoustic signal of the electrical spark is detected, and/or when the optical signal of the electrical spark is detected.

In the above condition detecting device, optionally, the controller is further configured to perform one or more of the following operations when it is judged that the surface insulation layer is defective: sending a sound alarm, sending a visual alarm, stopping the elevator, and parking the elevator at the closest floor.

In the above condition detecting device, optionally, the dimension of the detecting component is set to be larger than or equal to the width dimension of the elevator traction belt.

In the above condition detecting device, optionally, the detecting component includes a plurality of wires or filaments formed by a conductive material.

In the above condition detecting device, optionally, the static electricity generation component is configured to generate static electricity with a voltage of 2-10 kV and a pulse frequency of 10-100 Hz.

The condition detecting method and device for the surface insulation layer of the elevator traction belt of the present application have the advantages of being simple and reliable, easy to implement, and convenient to use, etc. The efficiency of detecting elevator components could be improved and the safety could be enhanced.

BRIEF DESCRIPTION OF THE DRAWINGS

The present application will be described below in further detail with reference to the accompanying drawings and preferred embodiments. Those skilled in the art will appreciate that these drawings are drawn only for the purpose of explaining the preferred embodiments and should not be construed as limiting the scope of the present application. In addition, unless specifically stated, the drawings are only intended to conceptually represent the composition or construction of the described objects and may contain exaggerated illustration, and the drawings are not necessarily drawn to scale.

DETAILED DESCRIPTION OF THE EMBODIMENT(S) OF THE INVENTION

Figure 1:
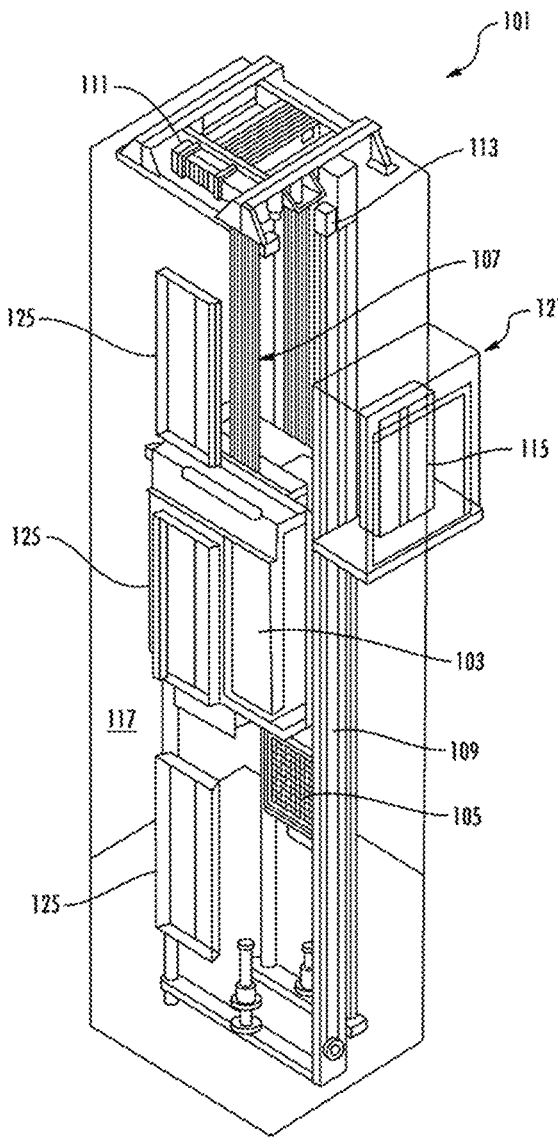
FIG. 1 is a schematic structural view of an elevator.

Hereinafter, preferred embodiments of the present application will be described in detail with reference to the accompanying drawings. Those skilled in the art will appreciate that these descriptions are merely illustrative and exemplary, and should not be construed as limiting the scope of protection of the present application.

Firstly, it should be noted that the orientation terms such as top, bottom, upward, and downward mentioned herein are defined with respect to the directions in various drawings. They are relative concepts, and therefore can be changed according to different positions and different states of use. Accordingly, these or other orientation terms should not be interpreted as restrictive.

In addition, it should also be noted that for any single technical feature described or implied in the embodiments herein, or any single technical feature shown or implied in the drawings, it is still possible to combine these technical features (or their equivalents) so as to obtain other embodiments that are not directly mentioned herein.

It should be noted that in different drawings, identical or substantially identical components are denoted by identical reference signs.

FIG. 1 is a schematic structural view of an elevator. An elevator system 101 includes a series of parts installed in a hoistway 117 which may be arranged across a plurality of floors 125, and an elevator door is disposed at the individual floors 125 respectively. The elevator system 101 includes an elevator car 103, a counterweight 105, a traction belt 107, a guide rail 109, a driver 111, a position detecting system 113, a controller 115, and the like. One end of the traction belt 107 is attached to the elevator car 103, and the other end of the traction belt 107 is attached to the counterweight 105. The counterweight 105 is configured to balance the weight of the elevator car 103. The traction belt 107 is moved by the driver 111 to selectively change the position of the elevator car 103 and park the elevator car 103 at a desired floor. The traction belt 107 may be, for example, a rope, a steel cable, or a coated steel belt. The traction belt 107 may also be associated with a pulley mechanism or pulley set (not shown) to achieve the desired lifting and lowering operations. It is easy to understand that the elevator car 103 is also correspondingly provided with a door for people to enter and exit the elevator car 103.

The driver 111 is disposed at the top of the hoistway and is configured to adjust the positions of the elevator car 103 and the counterweight 105. The driver 111 may be any suitable power supply device, including but not limited to an electric motor, etc. The driver 111 may be powered by a power source line or a power grid (not shown).

The position detecting system 113 may be installed to be fixed relative to the hoistway 117, and is preferably disposed at the top of the hoistway 117; for example, it may be installed on a bracket or a guide rail. The position detecting system 113 is further configured to sense the position of the elevator car 103 inside the hoistway 117 in order to provide a position signal related to the position of the elevator car 103. In another embodiment, the position detecting system 113 may also be arranged on other parts, for example, installed on a moving component. The position detecting system 113 may include an encoder, a sensor, or other suitable sensing systems, and the sensing method includes, but is not limited to, speed sensing, relative position sensing, absolute position sensing, and digital encoding sensing, etc.

The controller 115 may be disposed in an independent control room 121, or may be installed at another suitable location. In an embodiment, the controller 115 may also be disposed in a remote location or in the cloud. The controller 115 is configured to control the operation of the entire elevator system 101. For example, the controller 115 may adjust the operation of the driver 111 so that the elevator car 103 and the counterweight 105 are started, accelerated, decelerated, stopped, and so on. The controller 115 can perform the control operation according to the signal from the position detecting system 113. In an embodiment, the controller 115 is configured to enable the elevator car 103 to stop at one of the plurality of floors 125 and accelerate or decelerate between the plurality of floors 125.

The embodiment shown in FIG. 1 is provided only for ease of understanding. It is easy to understand that the condition detecting method and device for the surface insulation layer of the elevator traction belt according to the present application can be used in any suitable elevator system, such as a cordless elevator system including a linear motor.

Figure 2:
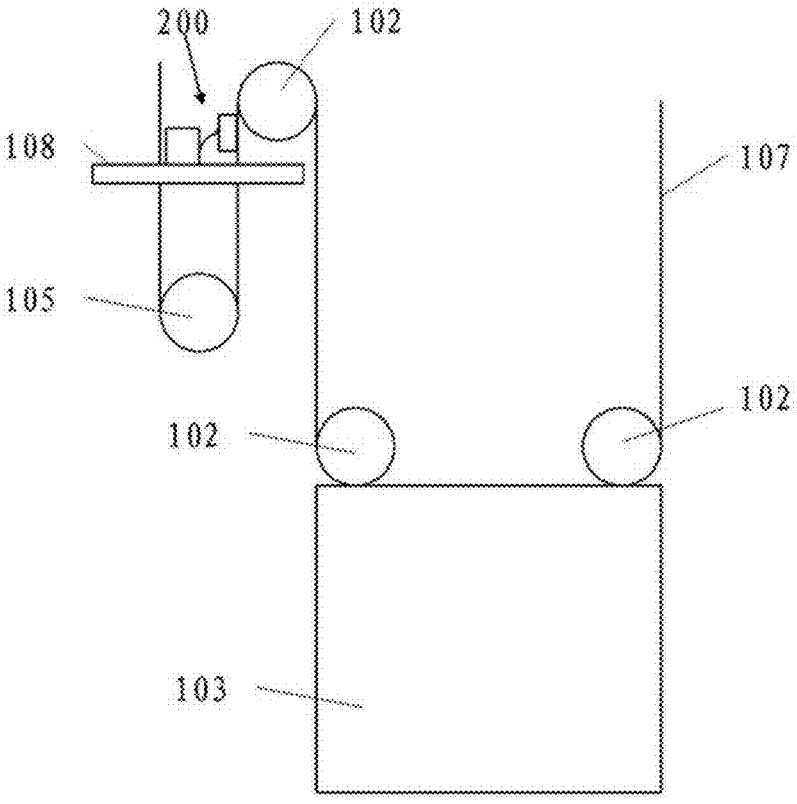
FIG. 2 is a schematic view of the elevator structure of the present application.

FIG. 2 is a schematic view of the structure of the elevator of the present application. FIG. 2 shows some components of the elevator. The elevator car 103 is suspended by the traction belt 107 via a plurality of pulleys 102 located at the top of the elevator car 103. The other end of the traction belt 107 is attached to the counterweight 105 through a pulley 102. During the operation, the counterweight 105 and the elevator car 103 will move in the vertical direction under the traction action of the traction belt 107. The present application also provides a platform 108 arranged in such a way that the traction belt 107 is movable relative to the platform 108. At least some components of the condition detecting device 200 for the surface insulation layer of the elevator traction belt according to the present application are arranged on the platform 108.

In an embodiment of the present application, the platform 108 may be a base for arranging the traction machine, or any other suitable elevator component or additional installed component. In this situation, the movement of the traction belt 107 relative to the platform 108 may cause the traction belt 107 to move relative to the condition detecting device 200.

In another embodiment, the condition detecting device 200 may be configured to be mobile. For example, the condition detecting device 200 may be configured to be held and moved by the user. In this situation, the movement of the traction belt 107 relative to the user may cause the traction belt 107 to move relative to the condition detecting device 200. For example, the traction belt 107 moves relative to the ground during operation, and the user and the condition detecting device 200 are stationary relative to the ground; or the traction belt 107 is stationary relative to the ground, and the user and the condition detecting device move relative to the ground.

Figure 3:
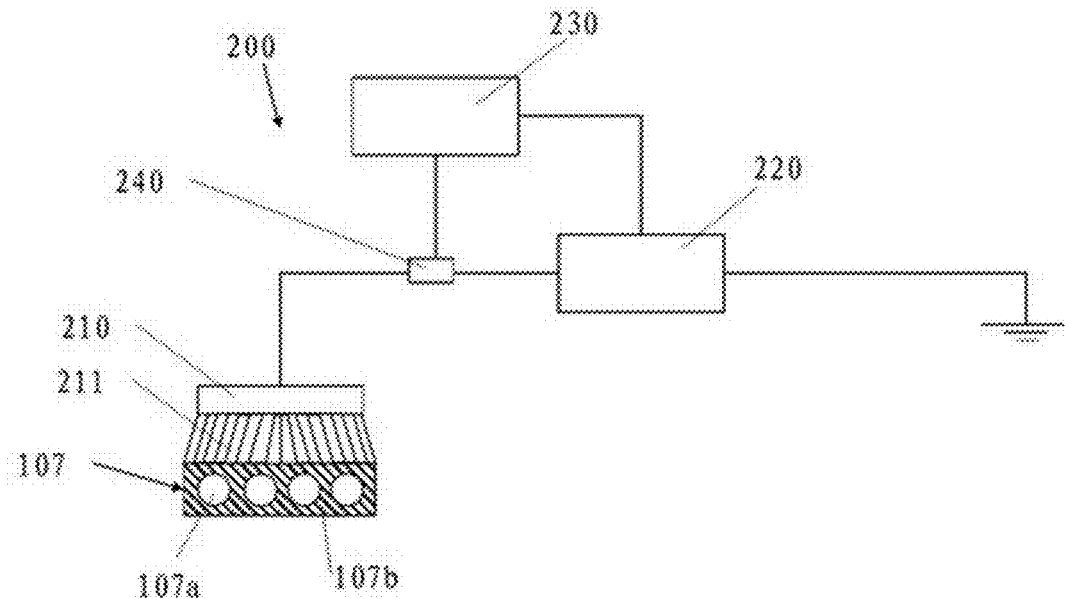
FIG. 3 is a schematic state diagram of an embodiment of a condition detecting device of the present application during operation.
Figure 4:
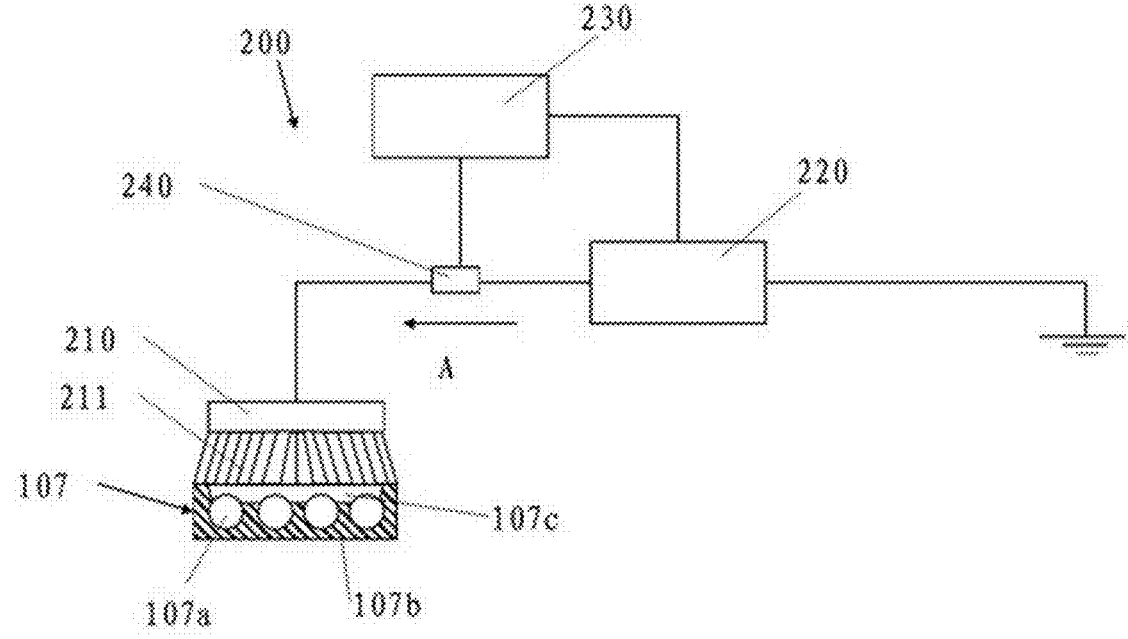
FIG. 4 is another schematic state diagram of the embodiment shown in FIG. 3 during operation.

FIG. 3 is a schematic state diagram of an embodiment of the condition detecting device of the present application during operation, and FIG. 4 is another schematic state diagram of the embodiment shown in FIG. 3 during operation. An embodiment of the condition detecting device 200 according to the present application includes: a detecting component 210 positioned adjacent to the surface insulation layer of the traction belt 107 of the elevator, and the traction belt 107 being movable relative to the detecting component 210; a static electricity generation component 220 electrically connected to the detecting component 210; and a controller 230 configured to cause the static electricity generation component 220 to apply static electricity to the detecting component 210, detect the reaction of the traction belt 107 to the static electricity, and identify the state or condition of the surface insulation layer of the traction belt 107 according to the detected reaction of the traction belt 107 to the static electricity.

In the illustrated embodiment, the condition detecting device 200 further includes a current sensor 240 that is electrically associated with the detecting component 210 and is configured to sense a current fluctuation generated between the detecting component 210 and the surface insulation layer of the traction belt 107. For example, the current sensor 240 may be connected in series with the detecting component 210 and the static electricity generation component 220.

The traction belt 107 may be any known type of elevator traction device, including but not limited to a traction steel belt known by those skilled in the art. The traction belt 107 includes cores 107a formed by a conductive material and a surface insulation layer 107b enclosing the cores 107a. FIGS. 3 and 4 show cross-sectional views of the traction belt 107, wherein the dimension of the traction belt 107 in the horizontal direction in the figures is hereinafter referred to as the width dimension, and the dimension in the vertical direction in the figures is referred to as the thickness dimension. It is easy to understand that the traction belt also extends in a direction perpendicular to the drawing plane and has a length dimension. The cores 107a and the surface insulation layer 107b extend along the entire length dimension. As shown in the cross-sectional views in FIGS. 3 and 4, a plurality of cores 107a may be distributed along the width dimension of the traction belt 107. The individual cores 107a may be separated from each other, or there may be electrical contact between the adjacent cores 107a. In the illustrated embodiment, the surface insulation layer 107b is distributed around each core 107a, therefore isolates the cores 107a from each other, and also isolates each core 107a from the outside. The surface insulation layer 107b usually has a sufficient thickness and is formed by an electrically insulated material.

Although not shown, it is easy to understand that the length dimension of the traction belt 107 is typically much larger than its width dimension, and the width dimension is typically much larger than its thickness dimension. A sufficiently long traction belt 107 has electrical characteristics similar to direct grounding. In other words, the cores 107a of the traction belt 107 may be regarded as having zero potential or equivalent to be grounded. In another embodiment, the traction belt 701 may also be physically grounded.

In addition, it is easy to understand that the condition detecting device 200 according to the present application can also be used to detect any cable with cores of conductive material and an enclosing insulation layer, including but not limited to the traction belt, the compensation rope and the electrical cable of the elevator.

The detecting component 210 may be a conductive brush, for example, a brush composed of a series or a plurality of filaments or wires 211. The wires 211 may be made of any suitable conductive material, including but not limited to various conductive metallic and non-metallic materials, such as copper, iron, carbon fiber, etc. As shown in the figures, the dimension of the detecting component 210 may be set to be substantially equal to the width dimension of the traction belt 107. However, the dimension of the detecting component 210 may also be set to be larger than the width dimension of the traction belt 107, or may be smaller than the width dimension of the traction belt 107. The detecting component 210 is electrically connected to components such as the static electricity generation component 220 through conductive wires.

The static electricity generation component 220 may be any suitable static electricity generation device. In an embodiment, the static electricity generation component 220 is configured to generate static electricity with a voltage of 2-10 kV and a pulse frequency of 10-100 Hz. For example, the generated static electricity may have a voltage of 2 kV, 4 kV, 5 kV, 6 kV, 7 kV, or 10 kV, and may have a pulse frequency of 40 Hz, 50 Hz, or 60 Hz. As shown, the static electricity generation component 220 may also be configured to be grounded.

The static electricity generation component 220 and the current sensor 240 are electrically connected to the controller 230. The controller 230 is configured to cause the static electricity generation component 220 to apply static electricity to the detecting component 210, detect the reaction of the traction belt 107 to the static electricity, and identify the condition of the traction belt 107 according to the detected reaction of the traction belt 107 to the static electricity.

Specifically, as shown in FIG. 3, if the surface insulation layer 107b of the traction belt 107 is intact, then the surface insulation layer 107b will isolate the cores 107a from the wires 211 of the detecting component 210. Therefore, there is no electrical path between the cores 107a and the wires 211, and the static electricity generated by the static electricity generation component 220 will not reach the cores 107a.

However, during the operation of the elevator, due to wearing, aging, or man-made damages, a slit 107c may develop in the surface insulation layer 107b of the traction belt 107. Due to the characteristics of the insulating material, the slit 107c usually extends from the surface of the traction belt 107 to the cores 107a (as schematically shown in FIG. 4), and may even extend across the entire cross-section. In addition, a hole extending from the surface to the cores 107a may also be formed on the surface of the traction belt 107. These slits or holes are generally undesirable because they may rapidly expand, causing cracking or failure of the surface insulation layer 107b, and posing a risk in elevator safety.

When the traction belt 107 moves relative to the detecting component 210, the holes or slits on the surface of the traction belt 107 also move relative to the detecting component 210. When the wire 211 of the detecting component 210 moves to be adjacent to hole or slit, an electrical path is formed between the wire 211 and the core 107a via air. As long as the static electricity generated by the static electricity generation component 220 has a sufficiently high voltage, the air between the wire 211 and the core 107a can be broken down or ionized, thereby forming an electrical path, and an electric spark and a current are generated between the detecting component 210 and the core 107a. The magnitude of this current depends on the specific situation, and the current sensor 240 is configured to sense the current fluctuation caused by the above current.

In an embodiment, the controller 230 is configured to judge that the surface insulation layer 107b is defective (such as with slits or holes) when it is detected that the current fluctuation between the detecting component 210 and the surface insulation layer 107b of the traction belt 107 exceeds a predetermined value. That is, in a case where no current fluctuation exceeding the predetermined value is sensed, the condition of the traction belt 107 is identified as normal. In a case where a current fluctuation exceeding the predetermined value is sensed, the condition of the traction belt 107 is identified as abnormal. The magnitude of the predetermined value may be set according to actual needs and sensitivity to defects; for example, it may be greater than 0.1 mA, greater than 0.05 mA, greater than 0.1 A, etc. The direction of the current may be, for example, in the direction indicated by arrow A in FIG. 4.

In another embodiment, the condition detecting device 200 may include an acoustic sensing device, such as a microphone or the like. The acoustic sensing device is configured to sense an acoustic signal propagating in the air when an electrical spark is generated. Similarly, the controller 230 is configured to judge that the surface insulation layer 107b is defective (such as with slits or holes) when an acoustic signal of the electric spark is detected.

In yet another embodiment, the condition detecting device 200 may include an optical sensing device, such as a camera or the like. The acoustic sensing device is configured to sense an optical signal emitted when the electrical spark is generated. Similarly, the controller 230 is configured to judge that the surface insulation layer 107b is defective (such as with slits or holes) when an optical signal of the electrical spark is detected.

In a case where the static electricity is a pulse having a certain frequency, the above-mentioned electrical spark and current fluctuation may occur continuously, thereby facilitating detection and judgment.

The controller 230 may be further configured to perform one or more of the following operations when it is judged that the surface insulation layer 107b is defective: sending a sound alarm, sending a visual alarm, stopping the elevator, and parking the elevator at the closest floor. The controller 230 may be an independent control component, or an existing control unit on the elevator may be applied to implement the function of the controller 230.

Referring again to FIG. 2, in an embodiment of the condition detecting device 200 of the present application, at least the detecting component 210 is mounted to be fixed relative to the platform 108 so that the traction belt 107 can move relative to the detecting component 210. Other components of the condition detecting device 200 may be disposed on the platform 108, or may be disposed at other suitable locations. In addition, by mounting the detecting component 210 on the platform 108, it is possible to detect the entire traction belt 107 of the elevator in the length direction, thereby avoiding the potential risk caused by incomplete manual detection.

The present application also relates to a condition detecting method. An embodiment of the condition detecting method according to the present application includes the following steps: positioning a detecting component adjacent to the surface insulation layer of the elevator traction belt; moving the elevator traction belt relative to the detecting component, so that the detecting component scans the surface insulation layer of the elevator traction belt; applying static electricity to the detecting component through a static electricity generation component; detecting the reaction of the elevator traction belt to the static electricity; and identifying the condition of the surface insulation layer of the elevator traction belt according to the detected reaction of the elevator traction belt to the static electricity.

According to the detailed description disclosed above in conjunction with the accompanying drawings, the detecting the reaction of the elevator traction belt to the static electricity includes detecting a current fluctuation between the detecting component and the surface insulation layer of the elevator traction belt, an acoustic signal of the electrical spark or an optical signal of the electrical spark. In case that the current fluctuation exceeds a predetermined value, or the acoustic signal or optical signal of the electrical spark is detected, the controller will identify the condition of the elevator traction belt as abnormal and take one or more of the countermeasures described above.

The condition detecting method and device disclosed in the present application have good sensitivity and can effectively detect defects in the surface insulation layer of the elevator traction belt. Comparing with artificial naked-eye visual detection, the condition detecting method and device of the present application provide significant improvements in terms of reliability, operating efficiency, and degree of automation.

The specification discloses the present application with reference to the accompanying drawings, and also enables those skilled in the art to implement the present application, including manufacturing and using any device or system, selecting suitable materials, and using any combined method. The scope of the present application is defined by the claimed technical solutions, and contains other examples that can be conceived by those skilled in the art. Such other examples should be considered as falling within the scope of protection determined by the technical solutions claimed in the present application, as long as such other examples include structural elements that are not different from the literal language of the claimed technical solutions, or such other examples include equivalent structural elements that are not substantively different from the literal language of the claimed technical solutions.

What is claimed is:

1. An elevator system comprising:

an elevator car suspended by an elevator traction belt; and a condition detecting device for a surface insulation layer of the elevator traction belt, the condition detecting device comprising:

a detecting component positioned adjacent to the surface insulation layer of the elevator traction belt;

a static electricity generation component electrically connected to the detecting component; and a controller configured to cause the static electricity generation component to apply static electricity to the detecting component, detect the reaction of the elevator traction belt to the static electricity, and identify the condition of the surface insulation layer of the elevator traction belt according to the detected reaction of the elevator traction belt to the static electricity.

2. The elevator system according to claim 1, wherein the static electricity generation component is configured to be grounded.

3. The elevator system according to claim 1, further comprising a sensing component configured to sense a current fluctuation between the detecting component and the surface insulation layer of the elevator traction belt, an acoustic signal of the electrical spark or an optical signal of the electrical spark.

4. The elevator system according to claim 3, wherein the controller is configured to judge that the surface insulation layer is defective, when it is detected that the current fluctuation between the detecting component and the surface insulation layer of the elevator traction belt exceeds a predetermined value, and/or when the acoustic signal of the electrical spark is detected, and/or when the optical signal of the electrical spark is detected.

5. The elevator system according to claim 4, wherein the controller is further configured to perform one or more of the following operations when it is judged that the surface insulation layer is defective: sending a sound alarm, sending a visual alarm, stopping the elevator, and parking the elevator at the closest floor.

6. The elevator system according to claim 1, wherein the dimension of the detecting component is set to be larger than or equal to the width dimension of the elevator traction belt.

7. The elevator system according to claim 1, wherein the detecting component comprises a plurality of wires or filaments formed by a conductive material.

8. The elevator system according to claim 1, wherein the static electricity generation component is configured to generate static electricity with a voltage of 2-10 kV and a pulse frequency of 10-100 Hz.

9. The elevator system according to claim 1, wherein the condition detecting device is movable relative to the elevator traction belt.

* * * * *